US009484221B2

(12) United States Patent
Schmidt et al.

(10) Patent No.: US 9,484,221 B2
(45) Date of Patent: Nov. 1, 2016

(54) BIPOLAR SEMICONDUCTOR DEVICE AND METHOD OF MANUFACTURING THEREOF

(71) Applicant: Infineon Technologies AG, Neubiberg (DE)

(72) Inventors: Gerhard Schmidt, Wernberg (AT); Josef Georg Bauer, Markt Indersdorf (DE)

(73) Assignee: Infineon Technologies AG, Neubiberg (DE)

( * ) Notice: Subject to any disclaimer, the term of this patent is extended or adjusted under 35 U.S.C. 154(b) by 208 days.

(21) Appl. No.: 14/153,377

(22) Filed: Jan. 13, 2014

(65) Prior Publication Data
US 2015/0200247 A1   Jul. 16, 2015

(51) Int. Cl.
*H01L 29/06* (2006.01)
*H01L 21/324* (2006.01)
(Continued)

(52) U.S. Cl.
CPC ....... *H01L 21/324* (2013.01); *H01L 21/26513* (2013.01); *H01L 27/0727* (2013.01);
(Continued)

(58) Field of Classification Search
CPC .............. H01L 29/66348; H01L 29/66136; H01L 29/7397; H01L 29/0834; H01L 21/324; H01L 27/0727; H01L 29/861; H01L 21/266; H01L 27/0761
USPC .......................................... 257/140; 438/138
See application file for complete search history.

(56) References Cited

U.S. PATENT DOCUMENTS 6,441,408 B2    8/2002  Porst et al.
2007/0158680 A1*  7/2007  Ozeki ................ H01L 27/0664
                                                          257/146
(Continued)

FOREIGN PATENT DOCUMENTS

DE     102007017788 A1    10/2008
WO        0004596 A2     1/2000

OTHER PUBLICATIONS

Pensl, G., et al., "Hydrogen Neutralization of Chalcogen Double Donor Denters in Single-Crystal Silicon." Materials Research Society Symposium Proceedings, 1987, pp. 241-246, vol. 104.
(Continued)

*Primary Examiner* — Asok K Sarkar
*Assistant Examiner* — Dmitriy Yemelyanov
(74) *Attorney, Agent, or Firm* — Murphy, Bilak & Homiller, PLLC

(57) ABSTRACT

A power semiconductor device has a semiconductor body having a first surface and a second surface that runs substantially parallel to the first surface. A first metallization is arranged on the first surface. A second metallization is arranged on the second surface. The semiconductor body includes an n-doped first semiconductor region spaced apart from the first metallization and having a first maximum doping concentration, an n-doped second semiconductor region having a second maximum doping concentration higher than the first maximum doping concentration and adjoining the first semiconductor region, and a third semiconductor region in ohmic contact with the second metallization, arranged between the second metallization and the second semiconductor region, and adjoining the second semiconductor region. The second semiconductor region is made of a semiconductor material which includes electrically active chalcogen impurities as donors. At least 90% of the electrically active chalcogen impurities form isolated defects in the semiconductor material.

11 Claims, 9 Drawing Sheets

(51) Int. Cl.
*H01L 29/66* (2006.01)
*H01L 29/739* (2006.01)
*H01L 29/861* (2006.01)
*H01L 29/08* (2006.01)
*H01L 21/265* (2006.01)
*H01L 27/07* (2006.01)

(52) U.S. Cl.
CPC ..... *H01L29/0834* (2013.01); *H01L 29/66136* (2013.01); *H01L 29/66348* (2013.01); *H01L 29/7397* (2013.01); *H01L 29/861* (2013.01); *H01L 27/0761* (2013.01)

(56) References Cited

U.S. PATENT DOCUMENTS

2012/0037955 A1* 2/2012 Hirler ............... H01L 21/26506
 257/140
2012/0248576 A1* 10/2012 Schmidt ................ H01L 21/223
 257/607

OTHER PUBLICATIONS

Strunk, H., et al., "Interstitial Supersaturation Near Phosphorus-Diffused Emitter Zones in Silicon." Applied Physics Letters, Apr. 15, 1979, pp. 530-532, vol. 34, American Institute of Physics.

* cited by examiner

BIPOLAR SEMICONDUCTOR DEVICE AND METHOD OF MANUFACTURING THEREOF

TECHNICAL FIELD

Embodiments of the present invention relate to bipolar semiconductor devices, in particular to bipolar power semiconductor devices for high reverse voltages, and to related methods for producing bipolar semiconductor devices.

BACKGROUND

Many functions of modern devices in automotive, consumer and industrial applications, such as converting electrical energy and driving an electric motor or an electric machine, rely on semiconductor devices. Insulated Gate Bipolar Transistors (IGBTs) combine isolated gate electrodes for controlling the current with the high-current and low-saturation-voltage capability of bipolar transistors and have thus been used for various applications including but not limited to traction motor control and as switches in power supplies and power converters, in particular for medium- to high-power applications.

Meanwhile, dynamic properties such as switching losses and softness of power semiconductor devices have become more important. Further, the robustness (ruggedness) under high switching speed is often desired to be high. Even further, a degradation of the characteristic blocking curves of power semiconductors is often to be avoided. For power IGBTs and associated free-wheeling diodes for high reverse voltages (blocking voltages) of at least about 3 kV, an n-doped field-stop layer arranged next to a p-doped backside emitter or cathode region and having a higher dopant concentration than an adjoining n-doped drift or base layer may be provided to reduce switching losses. There are bipolar power semiconductor devices with field-stop layer which have a high switching robustness. However, manufacturing variations may result in less stronger IGBT power devices which are not detected during series tests typically carried out at lower switching speeds. During operation, the less strong IGBTs may cause failure at high switching speeds of more than $10^8$ V/s or more than $10^9$ V/s. Therefore, further improvements with regard to switching robustness of bipolar semiconductor devices at high switching speeds (hard commutating) and suitable manufacturing processes are desired.

SUMMARY

According to an embodiment of a power semiconductor device, the power semiconductor device includes a semiconductor body having a first surface and a second surface that runs substantially parallel to the first surface. A first metallization is arranged on the first surface. A second metallization is arranged on the second surface. The semiconductor body includes an n-doped first semiconductor region spaced apart from the first metallization and having a first maximum doping concentration, an n-doped second semiconductor region having a second maximum doping concentration higher than the first maximum doping concentration and adjoining the first semiconductor region, and a third semiconductor region in ohmic contact with the second metallization, arranged between the second metallization and the second semiconductor region, and adjoining the second semiconductor region. The second semiconductor region is made of a semiconductor material which includes electrically active chalcogen impurities as donors. At least 90% of the electrically active chalcogen impurities form isolated defects in the semiconductor material.

According to an embodiment of a bipolar semiconductor device, the bipolar semiconductor device includes a semiconductor body of a monocrystalline semiconductor material extending between a first surface and a second surface that runs substantially parallel to the first surface. The semiconductor body includes a pn-junction, an n-doped field-stop layer spaced apart from the first surface and the second surface and including chalcogen impurities as n-type dopants, and an n-doped base layer having a lower maximum doping concentration than the field-stop layer and extending from the field-stop layer to the pn-junction. At least 90% of said chalcogen impurities form isolated defects in the monocrystalline semiconductor material and have a recharging time constant of at least about 1 s at room temperature.

According to an embodiment of a method for producing a bipolar semiconductor device, the method includes: providing a semiconductor substrate having a first side and a second side opposite to the first side, and comprising an n-type semiconductor layer; implanting chalcogens into a first sub-layer of the n-type semiconductor layer; performing a first annealing process at a first temperature for at least about 10 min; implanting dopants into a second sub-layer of the n-type semiconductor layer next to the second side; and performing a second annealing process at a second temperature not higher than the first temperature.

Those skilled in the art will recognize additional features and advantages upon reading the following detailed description, and upon viewing the accompanying drawings.

BRIEF DESCRIPTION OF THE DRAWINGS

The components in the Figures are not necessarily to scale; instead emphasis is placed upon the principles illustrated therein.

DETAILED DESCRIPTION

Figure 1:
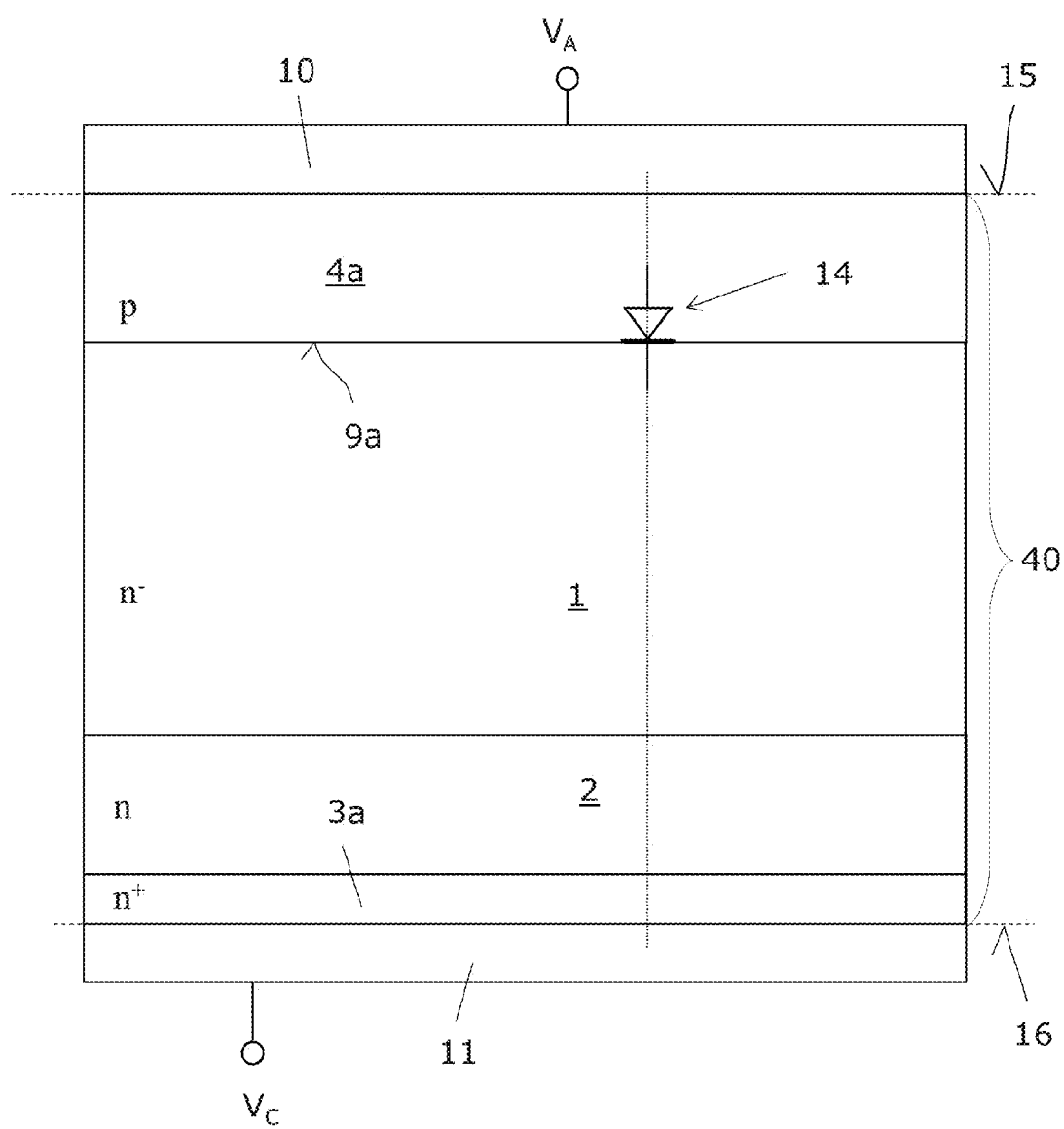
FIG. 1 illustrates a cross-section through a semiconductor body of a vertical semiconductor device according to an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments can be positioned in a number of different orientations, the directional terminology is used for purposes of illustration and is in no way limiting. Other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration that is less than the doping concentration of an "n"-doping region while an "n$^+$"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

Specific embodiments described in this specification pertain to, without being limited thereto, to relate to bipolar semiconductor devices such as IGBTs and bipolar diodes, in particular to bipolar power semiconductor devices for high reverse voltages, and to manufacturing methods therefor.

Typically, the semiconductor device is a power semiconductor device having an active area with a plurality of diode-cells for rectifying a load current between two power metallization (an anode and a cathode metallization) and/or a plurality of IGBTs for controlling a load current between two power metallization (an emitter metallization and a collector metallization). Further, the semiconductor device is typically a vertical semiconductor device with two power metallization which are arranged opposite to each other. Furthermore, the power semiconductor device may have a peripheral area with at least one edge-termination structure at least partially surrounding an active area of active cells when seen from above.

The term "power semiconductor device" as used in this specification intends to describe a semiconductor device on a single chip with high voltage and/or high current switching capabilities. In other words, power semiconductor devices are intended for high current, typically in the range of one up to several hundred Amperes and/or high voltages, typically above 100 V, more typically above 400 V, even more typically above 600 V and even up to several kV.

The term "commutating" as used in this specification intends to describe the switching of the current of a bipolar semiconductor device from the forward direction or conducting direction in which a pn-load junction, for example the pn-junction between the body region and the drift or base region of a MOSFET or an IGBT, is forwardly biased to the opposite direction or reverse direction in which the pn-load junction is reversely biased. The term "hard commutating" as used in this specification intends to describe commutating with a rise of the reverse voltage at the device of at least about $10^9$ V/s, more typically with a speed of at least about $3*10^9$ V/s.

In the context of the present specification, the terms "in ohmic contact," in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously. In some embodiments, the resistivity of a low resistive current path between respective elements or portions of a semiconductor device which is low when low voltages are applied to and/or across the semiconductor device, for example a probe voltage of less than one or a few volts, becomes high above a threshold voltage, for example due to depleting a semiconductor region forming at least a part of the current path.

In the context of the present specification, the term "metallization" intends to describe a region or a layer with metallic or near metallic properties with respect to electric conductivity. A metallization may be in contact with a semiconductor region to form an electrode, a pad and/or a terminal of the semiconductor device. The metallization may be made of and/or comprise a metal such as Al, Ti, W, Cu, and Mo, or a metal alloy such as NiAl, but may also be made of a material with metallic or near metallic properties with respect to electric conductivity such as highly doped n-type or p-type poly-Si, TiN, an electrically conductive silicide such as $TaSi_2$, $TiSi_2$, PtSi, $WSi_2$, MoSi, or an electrically conductive carbide such as AlC, NiC, MoC, TiC, PtC, WC or the like. The metallization may also include different electrically conductive materials, for example a stack of those materials.

In the context of the present specification, the term "depletable region" or "depletable zone" is intended to describe the fact that the corresponding semiconductor region or the corresponding semiconductor zone is substantially fully depleted (substantially free of free charge carriers) during the off state of the semiconductor component with an applied reverse voltage lying above a given threshold value. For this purpose, the doping charge of the depletable region is set accordingly and, in one or more embodiments, the depletable region is a weakly doped region. In the off state, the depletable region(s) form depleted region(s), also referred to as space charge region(s), typically a contiguous depleted zone, whereby the current flow between two electrodes or metallizations connected to the semiconductor body can be prevented.

In the following, embodiments pertaining to semiconductor devices and manufacturing methods for forming semiconductor devices are explained mainly with reference to silicon (Si) semiconductor devices having a monocrystalline Si semiconductor body. Accordingly, a semiconductor region or layer is typically a monocrystalline Si-region or Si-layer if not stated otherwise. However, the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN) and gallium arsenide (GaAs). For power semiconductor applications, mainly Si, SiC, GaAs and GaN materials are used. If the semiconductor body is made of a wide band-gap material, i.e. of a semiconductor material with a band-gap of at least about two electron volts such as SiC or GaN and having a high breakdown field strength and high critical avalanche field strength, respectively, the doping of the respective semiconductor regions can be chosen higher which reduces the on-state resistance $R_{on}$.

FIG. 1 shows, in a vertical cross-section, a first embodiment of a vertical semiconductor device 100 having a semiconductor body 40. On a first surface 15 of the semiconductor body 40 a first metallization or first electrode 10 and on the second surface 16 opposite to the first surface 15 a second metallization or second electrode 11 are arranged, respectively, typically over the whole active area. The direction of the normal to the first surface 15 defines a vertical direction.

The semiconductor body 40 contains an n-doped first semiconductor region or semiconductor layer 1 having a first maximum doping concentration of n-dopants that is in ohmic contact with the second metallization 11. In the following, the first semiconductor region 1 is also referred to as base layer and base region. The n-doped first semiconductor region 1 is spaced apart from the first metallization 15 by a p-type fourth semiconductor region 4a forming a pn-junction 9a with the first semiconductor region 1. The fourth semiconductor region 4a is also referred to as anode emitter region and anode region 4a and typically in Ohmic contact with the first metallization 15. Accordingly, bipolar current path(s) may be formed between the first metallization 10, also referred to an anode metallization 10, and the second metallization 11, also referred to a cathode metallization 11. This is indicated by the diode symbol 14 and the dotted vertical line in FIG. 1. Thus, the semiconductor device 100 may be operated as diode. For example, the semiconductor device 100 may be used in a circuitry as a free-wheeling diode of an IGBT.

To form an ohmic contact with the anode region 4a and the anode metallization 10, a sufficiently high doping of the anode region 4a may be selected close to the anode metallization 10 and the first surface 15, respectively. Alternatively, a sufficiently highly p-doped additional contact portion (not shown and having a doping concentration of more than about $5*10^{18}/cm^3$) may be arranged between the anode region 4a and the anode metallization 10.

In the exemplary embodiment, the first semiconductor region 1 is spaced apart from the second surface 16 and the first surface 15. In other embodiments, the first semiconductor region 1 and the pn-junction 9a may, in a peripheral area (not shown in FIG. 1) typically surrounding the active area, extend to the first surface 15.

According to an embodiment, the semiconductor body 40 further includes an n-doped second semiconductor region 2 or second semiconductor layer having a second maximum doping concentration higher than the first maximum doping concentration arranged between the first semiconductor region 1 and the second metallization 11, and adjoining the first semiconductor region 1; and a third semiconductor region 3a or third semiconductor layer 3a arranged between and adjoining the second metallization 11 and the second semiconductor region 2.

The maximum doping concentration of the third semiconductor region 3a is typically higher than the second maximum doping concentration to ensure a direct ohmic contact with the second metallization 11. The third semiconductor region 3a is also referred to as cathode layer 3a. The vertical extension of the cathode layer 3a may be in a range from about a few ten nm to about 2 μm, or even larger.

Typically, the second semiconductor region 2 is spaced apart from the first surface 15 and the second surface 16, and acts a field-stop layer during device operation to improve the blocking behavior. The field-stop layer 2 may include different n-type dopants as donors. The maximum concentration of donors of the field-stop layer 2 may be in a range from about $5*10^{14}$ cm$^{-3}$ to about $5*10^{15}$ cm$^{-3}$. Further, the concentration of donors of the field-stop layer 2 may vary in vertical direction to tailor switching behaviour.

According to an embodiment, the monocrystalline semiconductor material (Si) of the field-stop layer 2 includes electrically active chalcogen impurities as donors, more typically sulfur, selenium and/or tellurium impurities as donors. A majority of the chalcogen impurities, typically at least 90% of the electrically active chalcogen impurities, form isolated defects (deep single traps) in the semiconductor material, i.e. single point defects having a an energy level (donor level) between the valence band edge of the semiconductor material and the conduction band edge of the semiconductor material. More typically, the energy level is at a distance from the valence band edge and the conduction band edge, respectively, of at least about 100 m eV (milli electron volts). Accordingly, the switching behaviour of the semiconductor device 100 may be improved. The energy level may be at least 200 m eV away from the conduction band edge of the semiconductor material.

Typically, a recharging time constant of at least a portion of the isolated defects, typically a majority of the isolated defects is larger than about 1 s at room temperature, more typically larger than about 10 s or even about 100 s at room temperature. The isolated defects may have different ionization states. In this embodiment, at least one of the ionization states has recharging time constant larger than about 1 s at room temperature, more typically larger than about 10 s or even about 100 s at room temperature. Due to the comparatively long recharging time, the softness during commutation may be improved. This is explained in more detail below with regard to FIGS. 6 to 8B. Further, the robustness during hard commutation of semiconductor device 100 may be improved. This is explained in more detail below with regard to FIG. 9.

The field-stop layer 2 may include further n-type dopants such as phosphorous, arsenic, antimony, and/or oxygen. These dopants may also be present in the first and second semiconductor layers 1, 3a.

Depending on the voltage class, the field-stop layer 2 may have a vertical extension of at least about 10 μm, for example of at least about 20 μm or even 25 μm.

Figure 2:
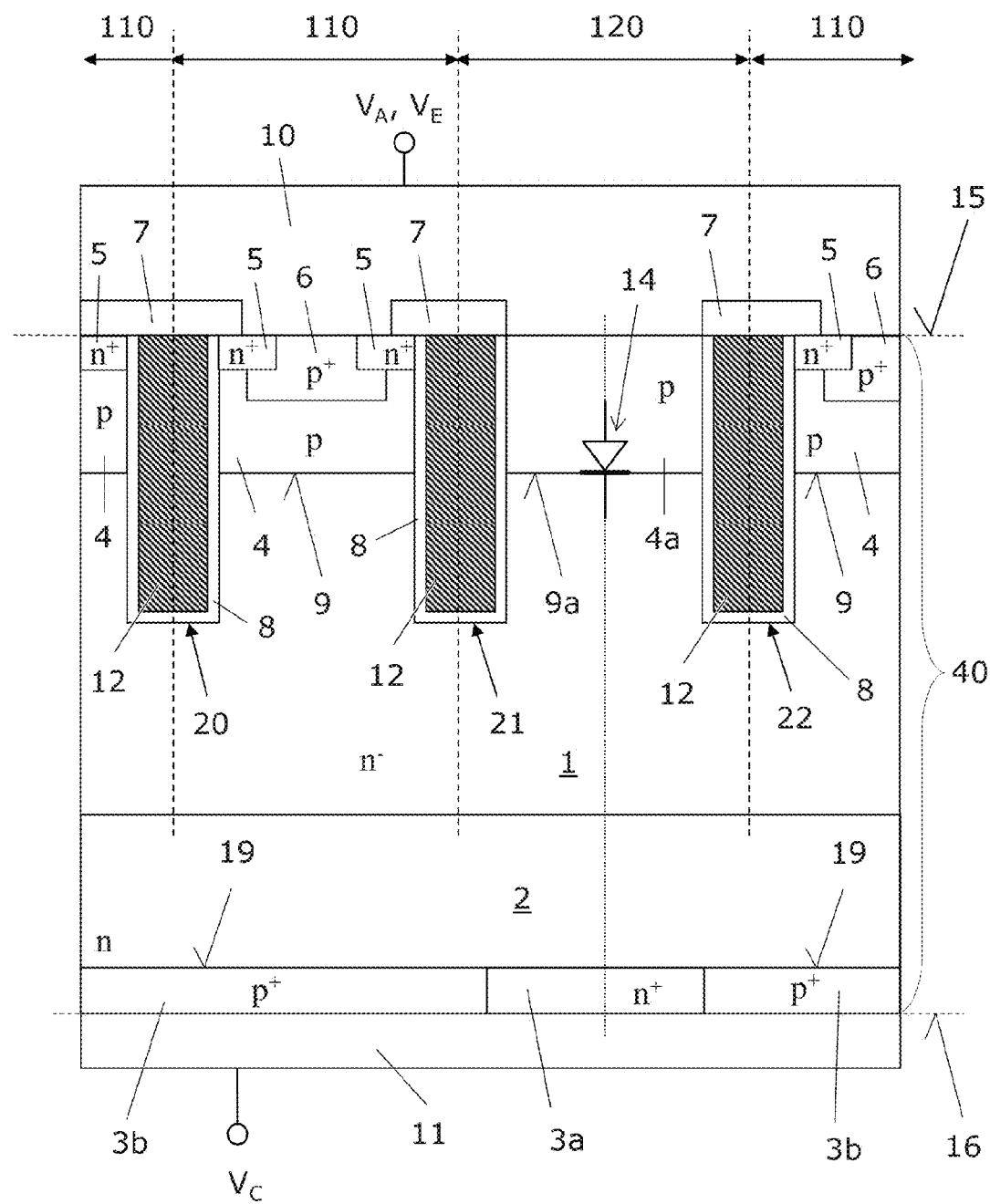
FIG. 2 illustrates a cross-section through a semiconductor body of a vertical semiconductor device according to an embodiment.

FIG. 2 schematically illustrates an embodiment of a semiconductor device 200 in a section of a vertical cross-section. The semiconductor device 200 also includes a semiconductor body 40 having a first surface 15 and a second surface arranged opposite the first surface 15.

The semiconductor body 40 includes an n-type base layer 1 which is arranged between the second surface 16 and the first surface 15. A first metallization 10 is arranged on the first surface 15 and a second metallization 11 is arranged on the second surface 16.

In the exemplary embodiment, a first vertical trench 20, a second vertical trench 21 and a third vertical trench 22 extend from the first surface 15 partially into the base layer 1. Each vertical trench 20, 21, 22 includes a respective gate electrode 12 which is insulated by a respective gate dielectric region 8 from the semiconductor body 40 and by an insulating plug 7 from the first metallization 10.

A p-type body region 4 extends between the first vertical trench 20 and the second vertical trench 21, i.e. between the gate dielectric regions 8 of the vertical trenches 20, 21. The body region 4 forms a first pn-junction 9 with the base layer 1. Two n$^+$-type emitter regions 5 in ohmic contact with the first metallization 10 are arranged between the first vertical trench 20 and the second vertical trench 21. Each of the two emitter regions 5 adjoins one of the first vertical trench 20 and the second vertical trench 21.

In the exemplary embodiment, a p$^+$-type anti-latch-up region 6 in ohmic contact with the first metallization 10 is arranged between the first vertical trench 20 and the second vertical trench 21. The anti-latch-up region 6 provides a low ohmic contact between the first metallization 10 and the body region 2.

A further pn-junction 19 is arranged vertically below the first pn-junction 9 and formed between the base layer 1 and a p$^+$-type backside hole emitter region 3b (also referred to as collector layer and collector region) in ohmic contact with the second metallization 11. Accordingly, the emitter regions 5 form with the body region 4, the base layer 1 and the backside hole emitter region 3b a thyristor structure between the first and second metallizations 10, 11 and between the insulated gate electrodes 12 in the first vertical trench 20 and the second vertical trench 21, respectively. The insulated gate electrodes 12 extend vertically from the main horizontal surface 15 below the first pn-junction 9. Accordingly, an n-type channel region may be formed in the body region 4 along the respective insulating region 8 between the emitter region 5 and the base layer 1 by appropriately biasing the gate electrode 12 relative to the first metallization 10. In other words, the semiconductor device 200 includes one or more IGBT-cell(s) 110 and may thus be operated as an IGBT. Accordingly, the first metallization 10 may form an emitter metallization 10 and the second metallization 11 may form a collector metallization 11.

In the exemplary embodiment, the second metallization 11 is typically in ohmic contact with the base layer 1 via an n-type contact region or backside n-emitter region 3b which is arranged between the second metallization 11 and the base layer 1 and has a maximum doping concentration which is higher than a maximum doping concentration of the base layer 1. Accordingly, a current may also flow in a reverse mode, in which the collector voltage $V_C$ is lower than the emitter voltage $V_E$, between the first and second metallizations 10, 11 and across the forwardly biased first pn-junction 9. In other words, semiconductor device 200 has a first integrated free-wheeling diode, with its current path running across the body diode formed between the body region 4, the base layer 1 and the cathode region 3a, and may thus be operated as a reverse conducting semiconductor device 200.

According to an embodiment, a p-type anode region 4a extends between the second vertical trench 21 and the third vertical trench 22 and forms a second pn-junction 9a with the base layer 1 only. Accordingly, the semiconductor device 200 may include one or more IGBT-cells 110 and one or more diode-cells 120 with an anode region 2a forming a second pn-junction 9a with the base layer 1. The diode cell 120 may, between the trenches 21, 22, substantially be formed as explained above with regard to FIG. 1. Further, the anode region 4a may have substantially the same or a lower doping concentration than the body region 4 of the IGBT-cells 110. Even further, the first pn-junction(s) 9 and the second pn-junction(s) 9a may be substantially coplanar.

The cathode or contact region 3a and the anode region 4a may overlap in a projection on a horizontal plane parallel to the first surface 15. Accordingly, a short current path through the additional integrated free-wheeling diode 14 may be provided in reverse mode of the semiconductor device 200.

According to an embodiment, the semiconductor device 200 is a vertical power semiconductor device with an active area having a plurality of IBGT-cells 110 and/or diode-cells 120 for carrying and/or controlling a load current, and a peripheral area with an edge-termination structure. In these embodiments, the IGBT-cells 110 and/or the diode-cells 120 may be arranged on a horizontal one- or two-dimensional lattice, for example on a hexagonal or quadratic lattice. The IGBT-cells 110 and the diode-cells 120 may also be arranged on different horizontal lattices.

Alternatively, the bipolar semiconductor device 200 may have only IGBT-cells 110 or only diode-cells 120 arranged on a horizontal lattice.

Typically, an n-doped contiguous field-stop layer 2 having chalcogen impurities forming isolated defects in the semiconductor material, e.g. isolated single selenium defects, as explained above with regard to FIG. 1 is arranged between the base layer 1 and the backside hole emitter region 3b and the contact region 3a which is optional for IGBTs 200. The base layer 1 and the higher doped field-stop layer 2 may, in the vertical cross-section, extend between two lateral edges, typically sawing edges, delimiting the semiconductor device 200 in a horizontal direction.

In the following, method for forming the bipolar semiconductor device 100, 200 are explained.

Figure 3:
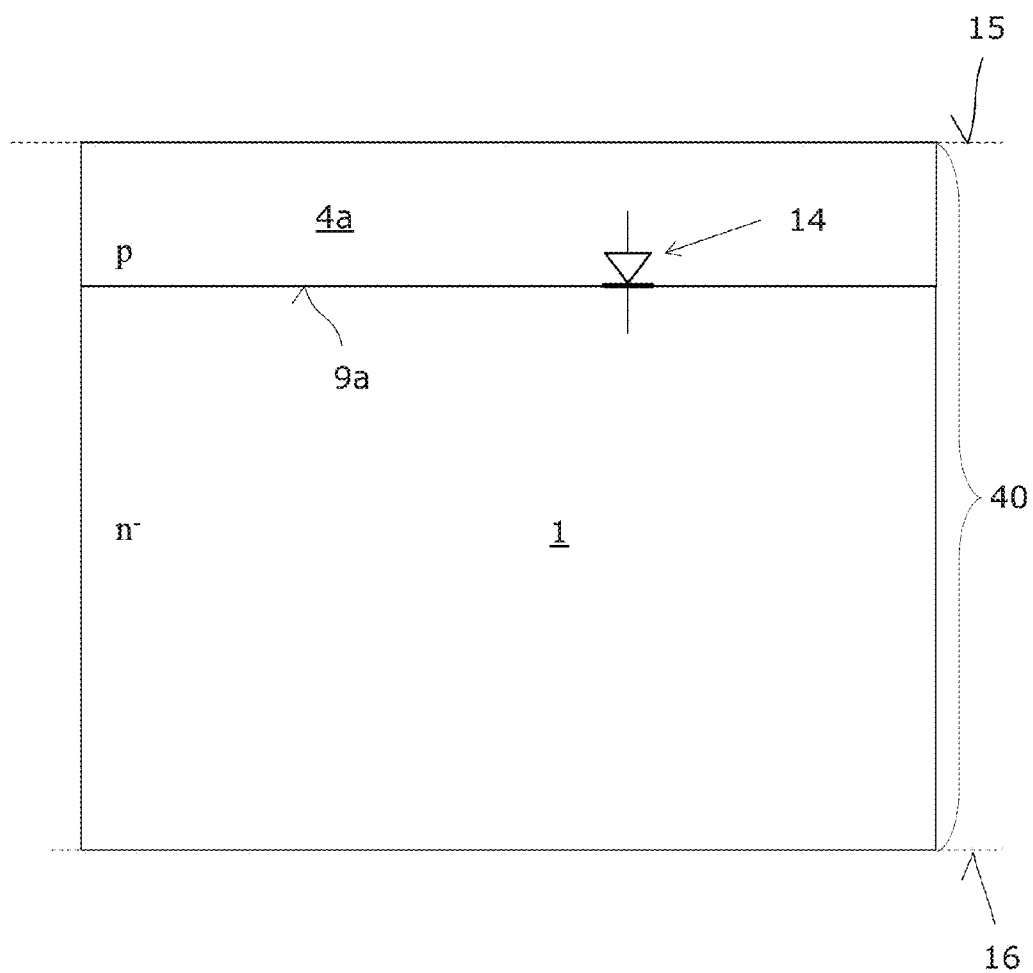
FIG. 3 to FIG. 5 illustrates vertical cross-sections through a semiconductor body during method steps of a method according to embodiments.
Figure 4:
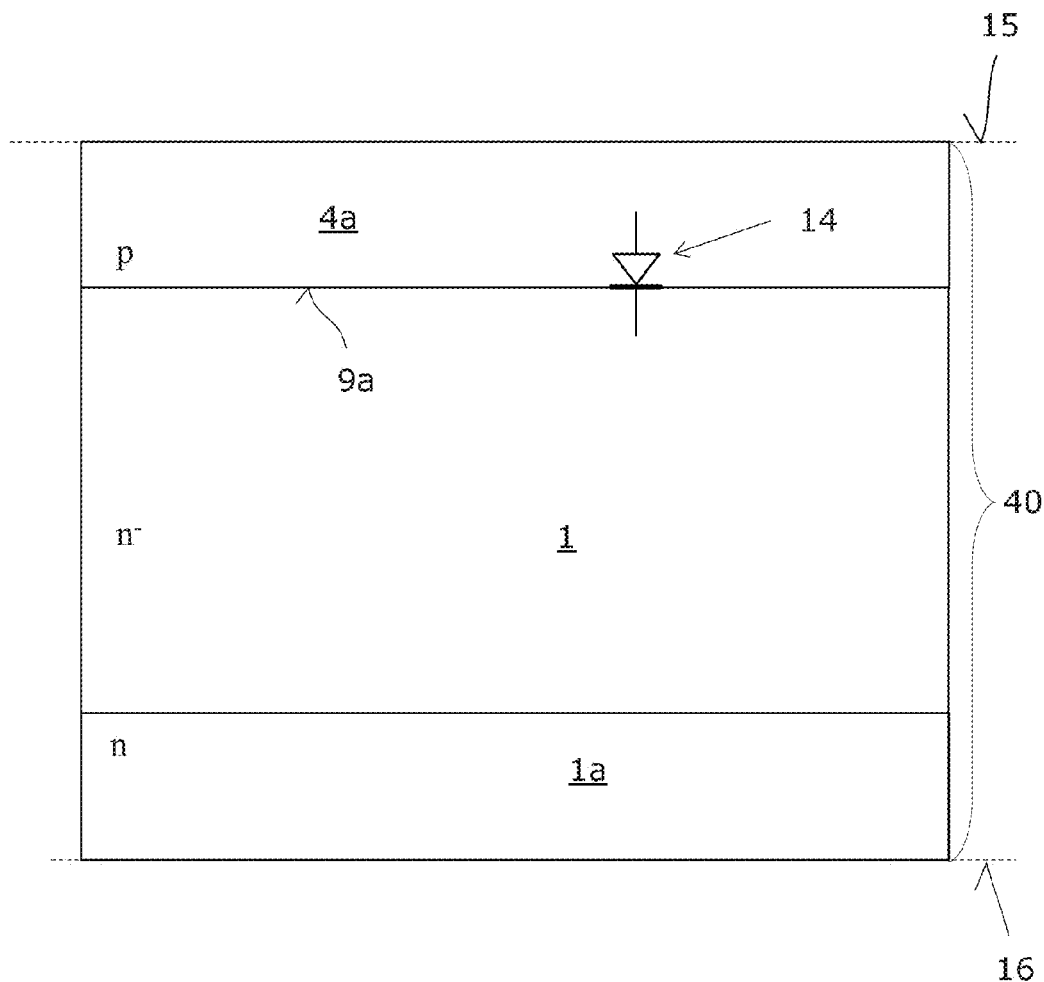
Figure 5:
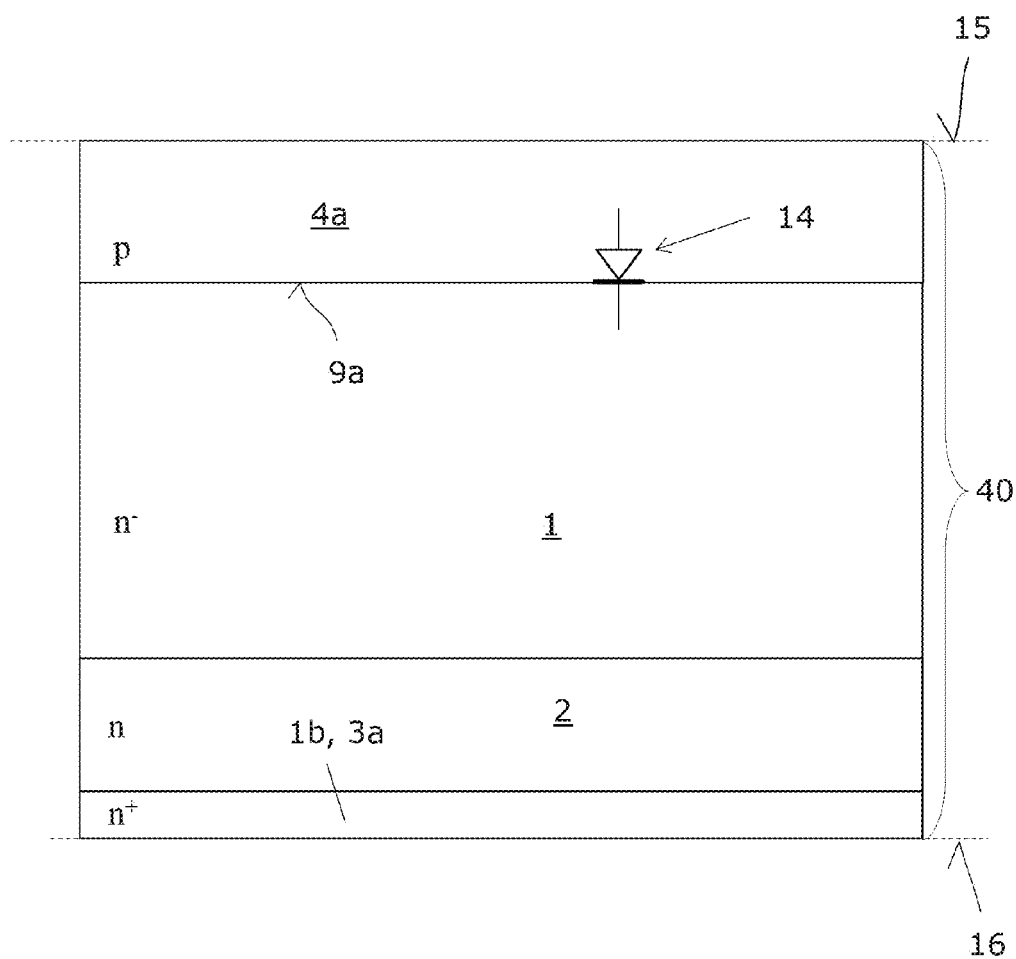

With regard to FIG. 3 to FIG. 5, method steps of a method for forming a semiconductor device 100 are illustrated in respective vertical cross-sections through a semiconductor body 40 which is typically a semiconductor wafer.

In a first step, a wafer 40, for example a Si-wafer, extending between a first side 15 or first surface 15 and a second side 16 or second surface 16 arranged opposite to the first side 15 is provided.

The wafer 40 typically includes an n-type semiconductor layer 1 extending to the second side 15 and a p-type layer 4a forming a pn-junction 9a with the first semiconductor layer 1 and extending to the first side 15. As illustrated in FIG. 3, the pn-junction 9 is typically substantially parallel to the first side 15 and second side 16, respectively.

Thereafter, selenium ions or other chalcogen ions may be implanted into a lower sub-layer 1a of the n-type semiconductor layer 1, typically from the second side 16. As illustrated in FIG. 4, the lower sub-layer 1a which is also referred to as first sub-layer may extend to the second side 16.

Thereafter, a first annealing process is performed at a first temperature for a first annealing time of at least about 10 min, more typically for at least about 30 min or 60 min, even more typically for at least about 90 min to diffuse and activate the implanted chalcogen ions. Accordingly, the vertical extension of the first sub-layer 1a is increased and the concentration of donors is increased in the first sub-layer 1a.

The implantation energy and dose during implanting chalcogen ions is typically chosen such that an upper portion 2a of the first sub-layer 1a may be operated as a field-stop layer. Note that the diffusion constants of chalcogens in silicon are comparatively high. This facilitates forming of sufficiently thick field-stop layers 2 below the n-doped base layer 1 formed by the remaining uppermost portion of the n-type semiconductor layer 1. In the semiconductor device 100 to be manufactured the concentration of chalcogens in the base layer 1 is typically at least one order of magnitude, more typically least two orders of magnitude lower compared to the field-stop layers 2. Note that the base layer 1 of the semiconductor device 100 to be manufactured is typically doped with other dopants such as phosphorous, arsenic, and antimony. This may be achieved by further implantations, and/or during the pulling process of the silicon rod.

When selenium ions are used as chalcogens impurities of silicon, implantation energy in a range from about 50 k eV to about 500 k eV and at dose ranging from about $10^{13}$ cm$^{-2}$ to about $10^{15}$ cm$^{-2}$ may be used.

Typically, the first temperature is at least about 950° C. This may depend on the annealing time and used chalcogen. For example, the first annealing may be performed for about 90 min or about 180 min at first temperature of about 950° C. or about 1000° C. for selenium ions implanted into silicon.

Thereafter, further n-type dopant ions such as phosphorus ions, arsenic ions and antimony ions may be implanted into a second sub-layer 1b of the n-type semiconductor layer 1 and the first sub-layer 1a, respectively, next to the second side 16. This implantation is typically performed from the second side 16. Note that the energy levels of those dopants are less than 50 m eV away from the conduction band edge of silicon. For example, phosphorus ions may be implanted from the second side 16 with a dose of about $10^{15}$ cm$^{-2}$ to about $10^{16}$ cm$^{-2}$ using an implantation energy of about 30 k eV to about 300 k eV.

Thereafter, a second annealing process at a second temperature not higher (typically lower) than the first temperature may be performed to at least partly activate the further n-type dopants next to the second side. Accordingly, a highly n-doped cathode layer 3a may be formed at the second side 16. Further, the second annealing process may also result in dissolving remaining pair chalcogen impurities in the adjoining field-stop layer 2. Accordingly, the device performance with regard to softness and/or robustness may be improved. The resulting semiconductor device 100 is illustrated in FIG. 5.

The second annealing process is typically performed for a second annealing time of at least about 10 min, more typically for at least about 30 min. However, it has been found that a comparatively short second annealing time resulting in only partly activating the further dopants is sufficient to ensure soft and robust switching behavior. Further, the second annealing time may be shorter than the first annealing time.

Typically, the second temperature is lower than the first temperature by at least about 20° C., more typically by at least about 50° C. For example, the second annealing may be performed for 30 min at about 900° C. while the first annealing may be performed for about 90 min at about 950° C.

The first annealing process and the second annealing process are typically performed as an oven process.

The method typically includes further steps of forming a front side metallization 10 on the first side 15 and a backside metallization 11 on the second side 15. The resulting semiconductor devices may correspond to the semiconductor device 100 illustrated in FIG. 1.

The steps of implanting the chalcogen ions into the first sub-layer 1a, performing the first annealing process, implanting the n-type dopants into the second sub-layer 1b and performing the second annealing process are typically performed after forming the front side metallization, i.e. after finishing processing the semiconductor substrate 40 from the first side 15. Accordingly, manufacturing may be facilitated.

In embodiments in which an IGBT is to be manufactured, finishing processing the semiconductor substrate 40 from the first side 15 typically includes forming n$^+$-type emitter regions and p$^+$-type anti-latch-up regions in the p-type layer 4, 4a and forming isolated gate electrodes extending from the first side 15 partly into the base layer 1. The latter typically includes forming vertical trenches from the first side 15 partly into the base layer 1, forming dielectric layers at side and bottom walls of the trenches and filling the trenches with a conductive material such a doped polysilicon.

According to an embodiment, protons are implanted from the second side 16 into the first sub-layer 1a after the first annealing process. For example, protons may be implanted from the second side 16 with a dose in a range of about $\cdot 10^{14}$ cm$^{-2}$ to about $5 \cdot 10^{14}$ cm$^{-2}$ using an implantation energy of about 2 to 3 M eV.

Thereafter, a further annealing process at a temperature lower than the first temperature, e.g. at a temperature of about 500° C. may be carried out to form oxygen donors in the field-stop layer 2.

In embodiments in which an IGBT is to be manufactured, p-type dopants are, prior to the second annealing, implanted instead of the n-type dopants. For example, boron ions may be implanted from the second side 16 with a dose in a range of about $\cdot 10^{13}$ cm$^{-2}$ to about $5 \cdot 10^{13}$ cm$^{-2}$ using an implantation energy of about 45 k eV.

In embodiments in which an rc-IGBT is to be manufactured, the p-type dopants are, prior to the second annealing, implanted in addition to the n-type dopants. In these embodiments, at least one of the corresponding implantations is performed as a masked implantation.

Due to using a first anneal process and a second anneal process, active chalcogen impurities forming isolated defects in the semiconductor material, in particular isolated defects with comparatively long recharging times are formed. Accordingly, the devices switching behavior is improved. This is explained in the following with regard to FIGS. 6 to 9.

Figure 6:
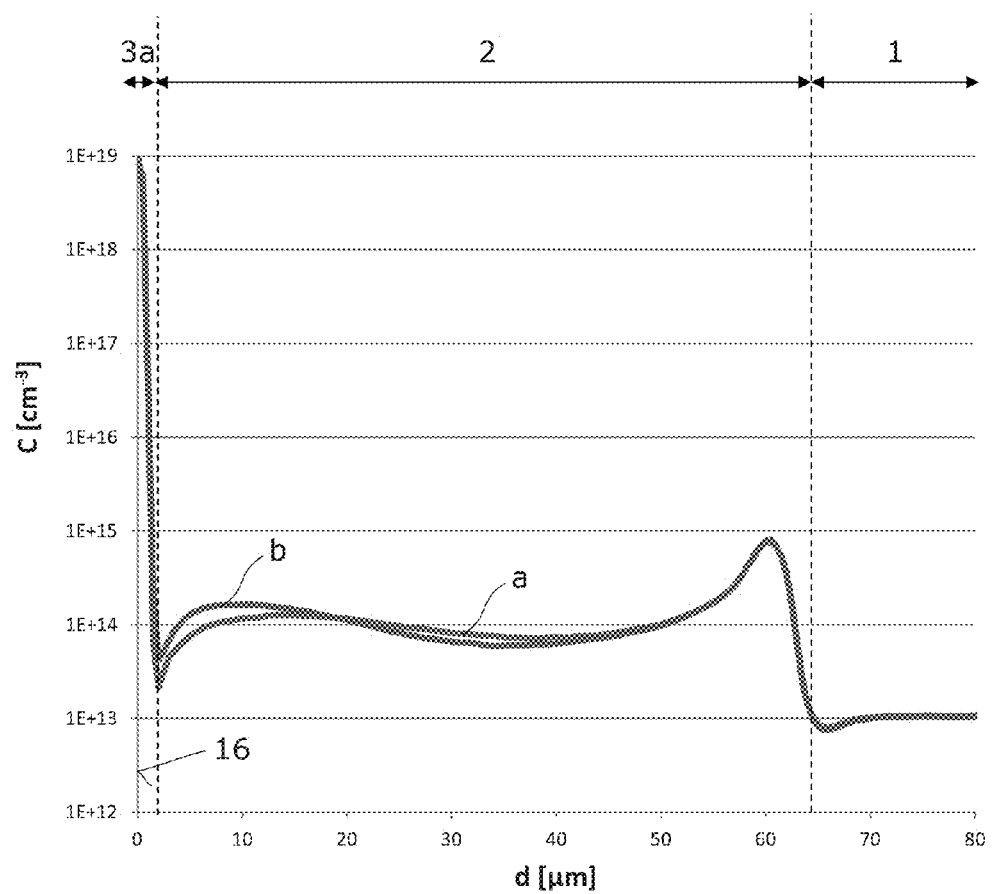
FIG. 6 illustrates doping profiles a semiconductor body of a vertical semiconductor device according to embodiments.

FIG. 6 illustrates two vertical profiles a, b of concentration C of donors (n-type dopants) as function of distance d from a second surface 16 of a silicon semiconductor body of a vertical semiconductor device as illustrated in FIG. 1 obtained by spreading resistance measurements. Curve a was obtained for a first diode as explained above with regard to FIG. 1 and manufactured using a first annealing process to diffuse and activate implanted selenium ions and a second annealing process to activate the phosphorous ions implanted next to the second side 16 and to further dissolve selenium pair impurities as explained above with regard to FIGS. 3 to 5. Curve b was obtained for a second diode which was manufactured using one common annealing process instead of two separate annealings. As can be inferred from the curves a, b, similar vertical donor profiles are obtained for both diodes. In particular, the overall donor dose of the field-stop layers 2 of both diodes is substantially equal. The peaks of the donor concentration at a distance of about 60 μm from the second surface 16 is due to a proton implantation.

However, the ratio between isolated single selenium defects and selenium pair defects is increased for the first diode due to using two annealing processes compared to a common one. This typically results in a softer switching behavior and increased robustness.

Figure 7:
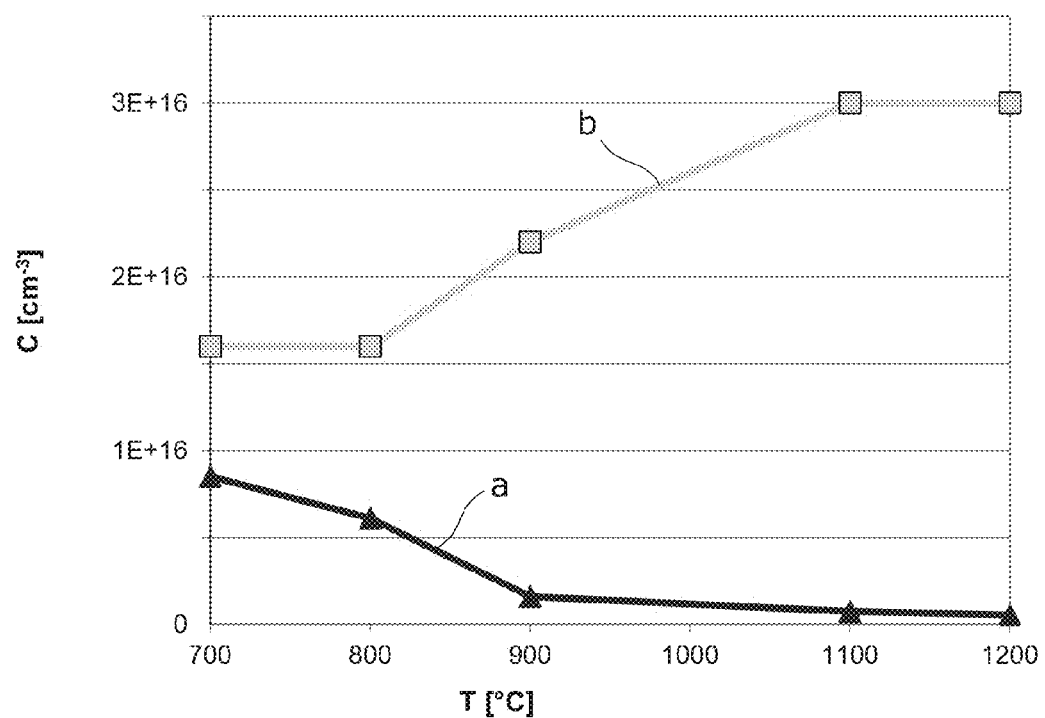
FIG. 7 illustrates doping concentrations as function of annealing temperature according to embodiments.

As illustrated in FIG. 7 showing concentrations C of single selenium defects $Se^+$ (curve b) and selenium pairs defects $Se_2^0$ (curve a) as function of annealing temperature T, ratios between single selenium defects $Se^+$ and pair impurities $Se_2^0$ of more than 10 to 1 or even more than 100 to 1 may be obtained above 900° C. At annealing temperatures of at least 1100° C. almost all selenium pairs defects $Se_2^0$ may be dissolved. Curves a and b were obtained by deep level transient spectroscopy. Thus, the typically higher overall thermal budget of the first and second annealings is expected to facilitate dissolving of selenium pair impurities.

Figure 8A:
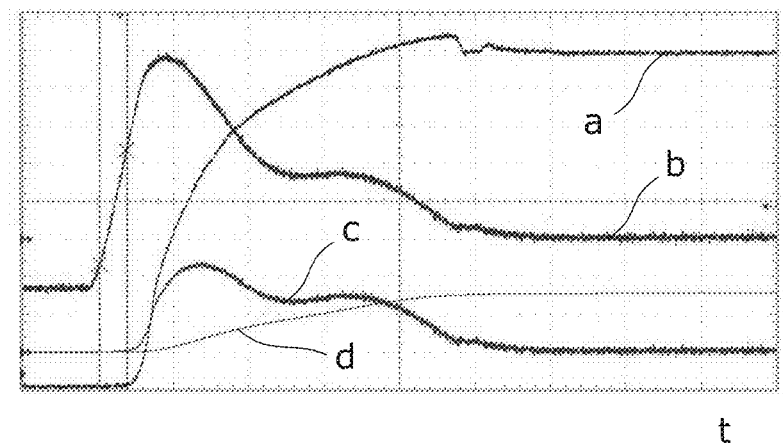
FIG. 8A and FIG. 8B illustrate switching behavior of vertical semiconductor devices according to embodiments.
Figure 8B:
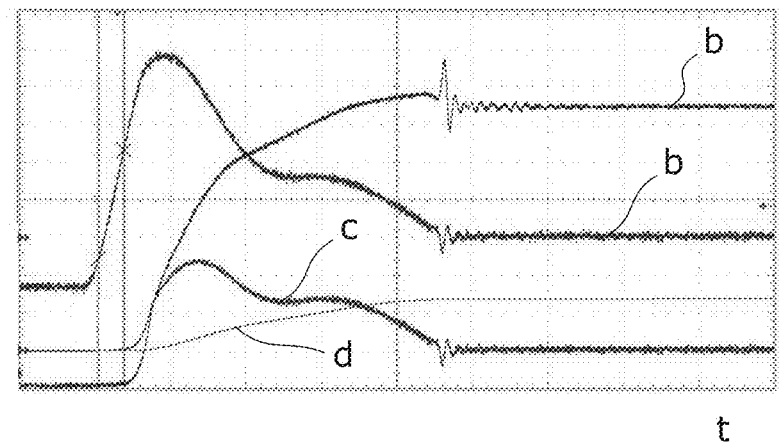

FIG. 8A illustrates the switching behavior of the first diode having the dopant profile shown in curve a of FIG. 6 but with increased fraction of single selenium defects $Se^+$ in the field-stop layer due to using two annealing. For comparison, the switching behavior at same hard switching condition of the second diode having the dopant profile shown in curve b of FIG. 6 is shown FIG. 8B. Curves a, b, c, and d correspond to voltage, current, power loss and switching energy (integrated power loss), respectively, as function of time t under safe operating area test conditions (at a switching power of 1250 kW). As can be seen by comparing the corresponding curves a to c, the increased fraction of single selenium defects $Se^+$ in the field-stop layer of the first diode results in shorter and lower amplitude oscillation, i.e. in a softer recovery during switching.

While the selenium pair defects in silicon have recharging time in the micro-second range already at room temperature (300° K), the doubly ionized single selenium defects $Se^+$ in silicon have at room temperature a recharging time of about 222 s. At about 400° C. the recharging time of the doubly ionized single selenium defects $Se^+$ in silicon is calculated to decrease down to about 1.8 s. Accordingly, a sufficiently long recharging time of this point defect in the field-stop layer resulting in a softer switching behavior is expected for typical operating temperatures. Note that the field-stop layer is not at thermal equilibrium during blocking mode. Due to the high electric field strength in the field-stop layer during the blocking mode, the Fermi-level of the semiconductor material is far below the equilibrium value. Accordingly, the single selenium defects are expected to be ionized twice under this condition.

Figure 9:
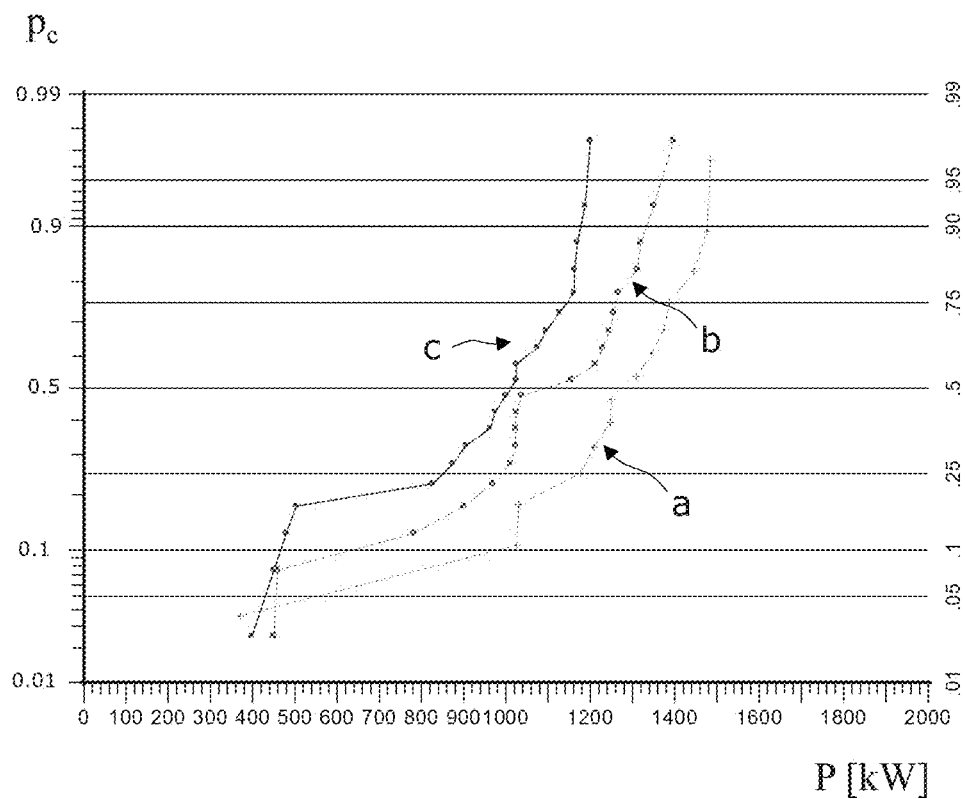
FIG. 9 illustrates cumulative frequency distributions of the switching power limit as function of switching power according to embodiments.

Furthermore, the robustness at high switching power and high switching speed, respectively, may be increased due to the higher fraction of single selenium defects $Se^+$. This can be inferred from FIG. 9 illustrating cumulative frequency distributions (cumulative probability of device default) $p_C$ as function of switching power P for the first diodes manufactured using a first annealing process at a first temperature of 950° C. for 90 min and a subsequent second annealing process (curve a), a first annealing process at a first temperature of 900° C. for 30 min and a subsequent second annealing process (curve b), and a common annealing process for the second diodes (curve c) which were all implemented as 4.5 kV diodes. Accordingly, the robustness of the diodes is improved already at comparatively low first temperatures of 900° C. and comparatively short first annealing times of 30 min. Further, higher temperatures and/or longer times of the first annealing result in a further improved robustness which is consistent with the data presented in FIG. 7. Similar results were obtained for 4.5 kV diodes and IGBTs.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific Figure may be combined with features of other Figures, even in those cases in which this has not explicitly been mentioned. Such modifications to the inventive concept are intended to be covered by the appended claims.

Spatially relative terms such as "under," "below," "lower," "over," "upper" and the like are used for ease of description to explain the positioning of one element relative to a second element. These terms are intended to encompass different orientations of the device in addition to different orientations than those depicted in the Figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:
1. A power semiconductor device, comprising:
a semiconductor body having a first surface and a second surface that runs substantially parallel to the first surface;
a first metallization arranged on the first surface; and a second metallization arranged on the second surface, wherein the semiconductor body comprises:

an n-doped first semiconductor region spaced apart from the first metallization and having a first maximum doping concentration;

an n-doped second semiconductor region having a second maximum doping concentration higher than the first maximum doping concentration and adjoining the first semiconductor region, wherein the second semiconductor region is comprised of a semiconductor material comprising electrically active chalcogen impurities as donors, and wherein at least 90% of the electrically active chalcogen impurities form isolated defects in the semiconductor material; and a third semiconductor region in ohmic contact with the second metallization, arranged between the second metallization and the second semiconductor region, and adjoining the second semiconductor region.

2. The power semiconductor device of claim 1, wherein the chalcogens are selected from the group consisting of sulfur, selenium and tellurium.

3. The power semiconductor device of claim 1, wherein the semiconductor material is selected from the group consisting of silicon, germanium, silicon carbide and/or gallium arsenide.

4. The power semiconductor device of claim 1, wherein a recharging time constant of at least a portion of the isolated defects is larger than about 1 s at room temperature.

5. The power semiconductor device of claim 1, wherein the second semiconductor region further comprises phosphorous, arsenic, antimony, and/or oxygen as n-type dopants.

6. The power semiconductor device of claim 1, wherein the second semiconductor region has, in a direction substantially orthogonal to the first surface, an extension of at least about 10 μm.

7. The power semiconductor device of claim 1, wherein the third semiconductor region is an n-doped semiconductor region having a third maximum doping concentration higher than the second maximum doping or wherein the third semiconductor region is a p-doped semiconductor region forming a further pn-junction with the second semiconductor region.

8. The power semiconductor device of claim 1, further comprising a p-type fourth semiconductor region arranged between the first semiconductor region and the first metallization, and forming a pn-junction with the first semiconductor region, wherein the semiconductor device is a diode, an IGBT or a reverse conducting IGBT.

9. A bipolar semiconductor device, comprising:

a semiconductor body comprising a monocrystalline semiconductor material extending between a first surface and a second surface that runs substantially parallel to the first surface, and comprising:

a pn-junction;

an n-doped field-stop layer comprising chalcogen impurities as n-type dopants, wherein at least 90% of said chalcogen impurities form isolated defects in the monocrystalline semiconductor material and have a recharging time constant of at least about 1 s at room temperature, the field-stop layer being spaced apart from the first surface and the second surface; and an n-doped base layer having a lower maximum doping concentration than the field-stop layer and extending from the field-stop layer to the pn-junction.

10. The bipolar semiconductor device of claim 9, further comprising at least one of:

an n-doped cathode layer having a higher maximum doping concentration than the field-stop layer, and extending from the second surface to the field-stop layer;

an p-doped collector layer extending from the second surface to the field-stop layer;

a p-doped semiconductor layer arranged between the first surface and the base layer and forming the pn-junction with the base layer;

a first metallization arranged on the first surface, wherein the pn-junction is arranged between the first metallization and the base layer;

a second metallization arranged on the second surface, and in ohmic contact with the collector layer and/or the cathode layer; and at least one trench extending from the first surface through the pn-junction and comprising a gate electrode isolated from the semiconductor body.

11. The bipolar semiconductor device of claim 9, wherein the monocrystalline semiconductor material is silicon, and wherein the chalcogen impurities are isolated single selenium defects.

* * * * *